United States Patent [19]
Biesterbos et al.
[11] 4,310,899
[45] Jan. 12, 1982

[54] THERMOMAGNETIC RECORD CARRIER

[75] Inventors: Johannes W. M. Biesterbos; Albertus G. Dirks, both of Eindhoven, Netherlands

[73] Assignee: U.S. Philips Corporation, New York, N.Y.

[21] Appl. No.: 111,139

[22] Filed: Jan. 10, 1980

[30] Foreign Application Priority Data

Jun. 2, 1979 [NL] Netherlands ........................ 7900921

[51] Int. Cl.³ .............................................. G11C 13/06

[52] U.S. Cl. .................................... 365/113; 365/122; 252/62.58

[58] Field of Search .................. 365/33, 34, 113, 122; 252/62.58; 75/123 B

[56] References Cited

U.S. PATENT DOCUMENTS 3,739,360 6/1973 Lacklison ............................ 365/33
3,979,736 9/1976 Marsh .................................. 365/34

FOREIGN PATENT DOCUMENTS 713370 8/1954 United Kingdom ............ 252/62.58

OTHER PUBLICATIONS

"An Overview of Optical Data Storage Technology," D. Cher et al., Proc. of the IEEE, vol. 63, No. 8, Aug. 1975, pp. 1207-1230.

*Primary Examiner*—James W. Moffitt
*Attorney, Agent, or Firm*—Marc D. Schechter

[57] ABSTRACT

A storage medium for use in a device for thermomagnetically writing and magneto-optically reading information. The medium comprises a nonmagnetizable substrate bearing an amorphous layer of a rare earth metal-iron type alloy (which contains from 20 to 30 atomic percent rare-earth metal/iron and 70 to 80 atomic percent iron) to which 15 to 30 atomic percent boron is added. The amorphous layer has a perpendicular easy axis of easy magnetization, required for the writing process, with a good stability against crystallization when heated to higher temperatures.

3 Claims, 5 Drawing Figures

THERMOMAGNETIC RECORD CARRIER

BACKGROUND OF THE INVENTION

The invention relates to a record carrier suitable for thermomagnetically writing and magneto-optically reading information. The record carrier comprises a non-magnetizable substrate which bears an amorphous layer of a rare-earth metal/iron alloy having an easy axis of magnetization perpendicular to the plane of the layer. The invention also relates to an optical memory device including such a record carrier. (A rare-earth metal is defined as an element having an atomic number from 57 to 71 inclusive).

Record carriers as described above are known from Netherlands Patent Application No. 7508707, which has been laid open to public inspection. This Application discloses a record carrier having a layer of iron-gadolinium, with approximately 40 atomic percent gadolinium, and 60 atomic percent iron, which has been deposited on a substrate by thermal evaporation in a vacuum. Thermomagnetic writing takes place by locally heating the layer, for example by means of a focused laser beam, to the Curie temperature of the alloy while the layer is in a magnetic field, and then cooling the layer. The direction of magnetization of the heated area of the layer reverses under the influence of magnetic stray fields of adjacent nonheated areas. (When the direction of magnetization reverses, an external magnetic field is also used sometimes which is directed opposite to the field in which the layer is present).

A disadvantage of the known record carrier is that the structure of the a morphous material changes irreversibly at comparatively low temperatures (from 100°-150° C.). The properties of the layer, notably the magnetic properties, also change. In the long run, this process leads to crystallization of the material. Since in practice the material repeatedly experiences a rise in temperature each time information is written, so as to bring it near the Curie temperature of the material, the above-described crystallization process is most undesirable.

SUMMARY OF THE INVENTION

It is an object of the invention to provide a record carrier of the kind described above which combines a perpendicular easy axis of magnetization with an increased stability against crystallization.

According to the invention this object is achieved in that the rare-earth metal/iron alloy contains from 15 to 30 atomic percent boron.

During the investigations which led to the invention, it was found that amorphous layers of rare earh metal/iron alloys (containing from 20 to 30 atomic percent rare earth metal and from 70 to 80 atomic percent iron) to which at least 15 atomic percent boron was added start showing crystallization phenomena only at a temperature which is approximately 200°C. higher than the temperature at which similar boron-free rare earth metal/iron alloys show crystallization phenomena. With additions of more than 30 atomic percent boron, the magnetic properties of the amorphous alloy layers were found to be less suitable for a thermomagnetic writing/magneto-optical reading process.

Once an alloy composition is available, which has a more stable amorphous state than those previously known, other alloy compositions related to this first composition may be prepared which have similar stability, in such a manner that a series of materials become available having previously determinable Curie temperatures. This is interesting because with every laser to be used for the writing process, a material having a writing sensitivity adapted to the power of the laser may be selected. The power required for writing is in fact also dictated by the temperature up to which the material has to be heated.

According to one aspect of the invention, a range of compositions for the amorphous layer of the record carrier of the kind described above, within which range the Curie temperature varies continuously, is defined by the formula:

$$\{(RE_y Gd_{1-y})_x Fe_{1-x}\}_{1-v} B_v$$

where RE is at least one of the elements Ho, Dy, and Tb, and $0.2 \leqq x \leqq 0.3$ $0 < y < 1$ $0.15 \leqq v \leqq 0.3$ In the range of compositions defined by the above formula, the Curie temperature will vary in the range between 20° C. and 230° C. dependng on the value of y. As a result, a material may be chosen having a desired writing sensitivity without the problem, even for materials having higher Curie temperatures, that they will crystallize when information is recorded at an increased temperature, particularly at a temperature in the vicinity of the Curie temperature. It furthermore appears that layers having the above-described composition have useful magnetic properties even if they are as thin as 500 or 1000 Å (important in this respect is in particular the perpendicular magnetic anisotropy), so that the information they contain can be read not only by reflection (by means of the Kerr effect), but also by transmission (by means of the Faraday effect).

The amorphous layer preferably comprises holmium as a second rare-earth metal in combination with gadolinium. In this combination the Curie temperature can be varied over the widest without losing the useful magnetic properties of the basic composition.

The invention also relates to an optical memory device for the thermomagnetic writting and magneto-optical reading of information. Such a device comprises a record carrier according to the invention, a source of radiation, means for directing radiation produced by the source of radiation onto selected areas on the amorphous layer (to raise the temperature thereof for a short period of time), means for magnetically biasing the amorphous layer perpendicularly to its surface, and magneto-optical reading means.

Some embodiments of the invention will now be described with reference to the following Examples and to the drawings.

DESCRIPTION OF THE PREFERRED EMBODIMENTS

EXAMPLES

Figure 1:
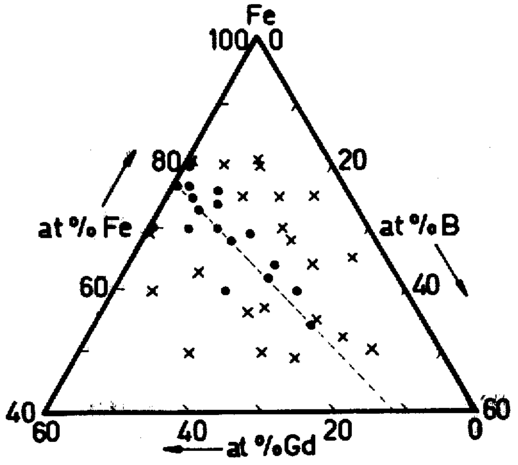
FIG. 1 shows a part of the ternary composition diagram of the system Gd-Fe-B.

A number of thin Gd-Fe-B layers having the compositions denoted by dots in the ternary composition diagram of FIG. 1, were made in an ultra-high vacuum vapor deposition apparatus. (However, this type of thin amorphous layer can also be obtained via a sputtering process, for example.) In order to realize compositions accurately, the elements were evaporated from separate sources by means of three electron beam guns. Each of these guns was controlled electronically by a quartz oscillator control present in the vapor beam emitted by the respective source. Prior to the vapor deposition process, the pressure in the vapor deposition bell was approximately $3\times10^{-10}$ Torr. During vapor deposition the pressure was below $5\times10^{-8}$ Torr. Quartz was used as a substrate. However, for example, barium titanate, glass, and silicon are also suitable substrate materials.

During the vapor deposition process, the substrate was at the point of intersection of the three vapor beams and was located 27 cm above the sources. Vapor deposition was carried out at a rate of 20 Å $sec^{-1}$ and the thickness of the vapor-deposited layer was approximately 1500 Å.

The amorphous state of the deposited material was confirmed by X-ray diffraction measurements.

The dots in FIG. 1 denote examples of compositions which at room temperature have an easy axis of magnetization perpendicular to the surface of the layer. It was found that in the neighborhood of the composition $Fe_{0.77}Gd_{0.23}$, up to approximately 30 atomic percent B may be added before this magnetic anisotropy disappears. The broken line in FIG. 1 denotes at what compositions the Fe:Gd ratio is 77:23. Along this line, the Curie temperature of two inventive compositions have been determined (see Table below) to an accuracy of ±5° C.:

TABLE

| | Composition | $T_c$(°C.) |
|---|---|---|
| 1. | $Fe_{0.62}Gd_{0.18}B_{0.20}$ | 245 |
| 2. | $Fe_{0.54}Gd_{0.16}B_{0.30}$ | 255 |

Figure 2:
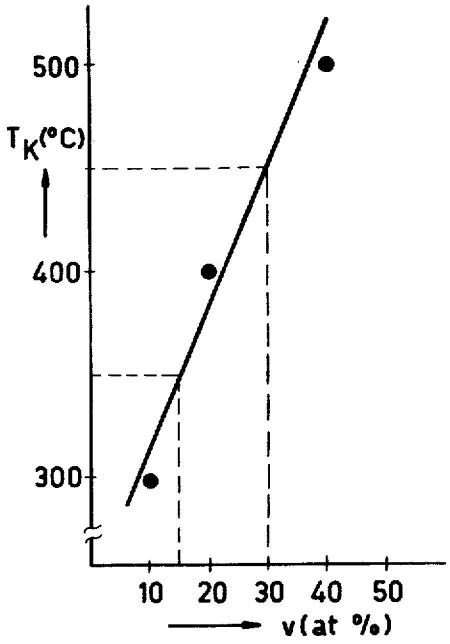
FIG. 2 is a graphic representation of the boron content of some Gd-Fe-B alloys in relation to the crystallization temperature $T_k$ of layers having that composition.

Stability FIG. 2 indicates that with the ratio Gd/Fe remaining the same and the boron content v increasing, the transition from the amorphous to the crystalline state in $(Gd_{0.23}Fe_{0.77})_{1-v}B_v$ layers is moved to higher temperatures. The temperature $T_k$ is the temperature at which the amorphous structure is split into a Gd-oxide network and α-Fe and FeB phases, respectively.

Figure 3:
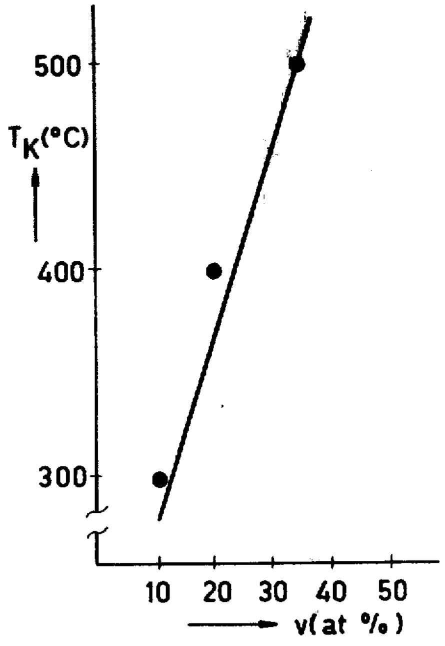
FIG. 3 is a graphic representation of the boron content of (Gd-Ho)-Fe-B alloys in relation to the crystallization temperature $T_k$ of layers having that composition.

When Gd is partly replaced by Ho, Dy or Tb, this does not prove to have any noticeable influence on the microstructure of the layers. FIG. 3 shows, in the same manner as FIG. 2, that with the ratio Gd/Fe/Ho remaining the same and the boron content v increasing, the transition from the amorphous to the crystalline state in $$\{(Gd_{1-y}Ho_y)_{0.23}Fe_{0.77}\}_{1-v}B_v$$

layers is delayed.

Figure 4:
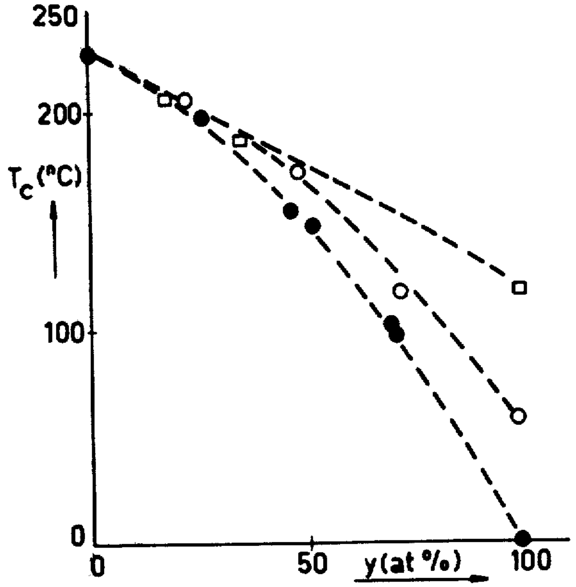
FIG. 4 is a graphic representation of the Curie temperature of three different Gd-Fe layers, also containing Ho, Dy or Tb, as a function of the type and the amount of the substitution.

In FIG. 4, $T_c$ is plotted against the fraction y for amorphous alloys of the composition $$Fe_{0.77}\{Gd_{1-y}(Ho,Dy,Tb)_y\}_{0.23}.$$

It has been found that a smooth variation of $T_c$ with y occurs both when Gd is partially replaced by Ho (dots), by Tb (open squares) and by Dy (circles). FIG. 4 shows the possibility of setting $T_c$ to a desired value between room temperature and 230° C. by varying the relevant rear-earth metals. The possible (small) influence of the addition of boron on $T_c$ has been left out of consideration.

It is known that the magnetic moment of the heavy rare-earth elements (having atomic nos. $Z\geqq64$) couples antiparallel with that of iron. This means that in some of these materials the magnetization becomes zero at a temperature below the Curie temperature ($T_c$). This temperature is called the compensation temperature ($T_{comp}$). for the thermomagnetic writing of information both $T_{comp}$ (compensation point writing) and $T_c$ (Curie point writing) may be used. A description of the $T_c$ and $T_{comp}$ writing techniques, respectively, can be found, for example, in the article entitled "An Overview of Optical Data Storage Technology" (D. Chen et al, Proceedings of the IEEE, Vol. 63, No. 8, August 1975, pp. 1207–1230).

Device

Figure 5:
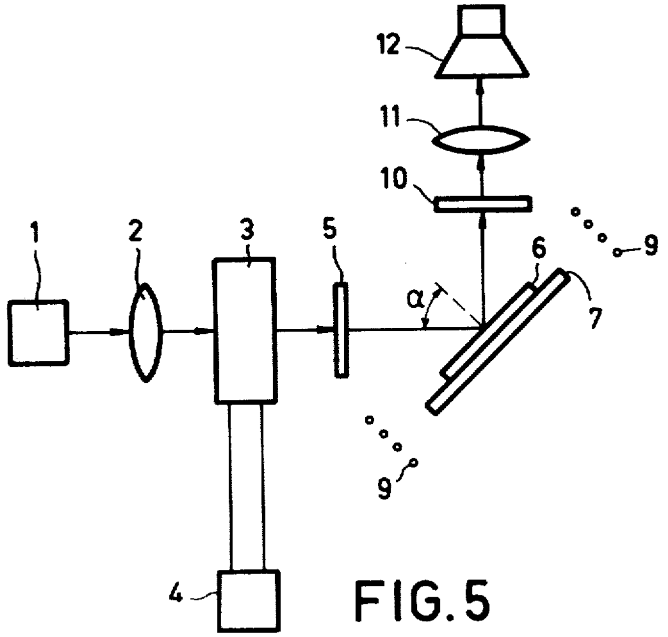
FIG. 5 schmatically shows a device for thermomagnetically writing and magneto-optically reading information.

FIG. 5 schematically shows a device for the thermomagnetic storage of information with magneto-optical reading. The device comprises an information storage unit comprising an amorphous layer 6 of magnetizable material provided on a substrate 7. The magnetizable material has the composition $(Fe_{0.78}Gd_{0.22})_{0.80}B_{0.20}$. For writing information bits the device has a radiation source 1. This may be, for example, a laser. By means of this source, energy pulses are generated which, after focusing by a lens 2 and after deflection by a deflection device 3, impinge on a selected site, or address on the layer 6. (For reasons of clarity the angle α which the incident light beam makes with the normal is shown as an angle of approximately 45°. Actually, α is substantially 0°). A decrease of the coercive force is produced at this site by the rise in temperature which is produced by the incident radiation. The location of a site is selected by an addressing device 4. Simultaneously, by energizing a coil 9, a magnetic field having a suitable field strength is switched on so as to orient the magnetization of the layer 6 perpendicularly to the surface of the layer 6. The stray magnetic fields of the surrounding areas of the layer ensure that upon cooling, the magnetization direction of the irradiated site is reversed. For reading the stored information, a polarizer 5 is placed between the deflection device 3 and the layer 6. An analyser 10, a lens 11 and a photoelectric cell 12 in this sequence are placed in the direction of travel of the reflected beam. For reading, the radiation source 1 is designed to provide a beam of radiation of lower energy than for writing, since it is not desirable for the layer 6 to be heated by the reading beam. The analyzer 10 has been rotated so that the light which is reflected by the parts of the layer 6 which are magnetized in a previously determined direction is extinguished. So only light which is reflected by the parts of the plate magnetized opposite to the first-mentioned direction is incident on the photoelectric cell 12.

Writing Process

Writing experiments have been carried out with a focused laser beam having a wavelength of 530 μm. Exposure was carried out through the substrate while simultaneously applying an external auxiliary magnetic field having a field strength of 45 Oersted. The amorphous layer was a 1500 Å thick layer having the composition $(Fe_{0.78}Gd_{0.22})_{0.80}B_{0.20}$.

Rows of information bits having a diameter of 4–5 μm and a mutual spacing of 4–5 μm could be written in the layer by means of the above-mentioned laser beam which provide a power of 17 mW on the layer and was pulsed with a pulse duration τ of $10^{-6}$ sec.

What is claimed is:

1. A record carrier, suitable for the thermomagnetic writing of information thereon and the magneto-optical reading of information therefrom, comprising a substantially planar, nonmagnetizable substrate and an amorphous layer of a rare-earth metal/iron alloy on said substrate, said alloy having an easy axis of magnetization perpendicular to the plane of the layer, characterized in that the rare-earth metal/iron alloy also contains boron, said alloy having a composition defined by the formula $$[RE_xFe_{1-x}]_{1-y}B_y$$

where RE is at least one rare-earth metal, and $0.2 \leqq x \leqq 0.3$, and $0.15 \leqq y \leqq 0.3$.

2. A record carrier as claimed in claim 1, characterized in that the alloy has a composition defined by the formula $$[(RE_yGd_{1-y})_xFe_{1-x}]_{1-y}B_y$$

where RE is at least one element from the group Ho, Dy and Tb, and $0<y<1$.

3. An optical memory device for the thermomagnetic writing of information on and the magneto-optical reading of information from the record carrier as claimed in claim 1 or 2, said memory device further comprising a source of radiation, means for directing the radiation produced by the source onto selected areas of the amorphous layer, means for magnetically biasing the amorphous layer in a direction perpendicular to its surface, and means for analyzing the polarization of the radiation reflected from or transmitted through the amorphous layer.

* * * * *